(12) United States Patent
Liu et al.

(10) Patent No.: US 8,120,251 B2
(45) Date of Patent: Feb. 21, 2012

(54) ELECTROLUMINESCENT DISPLAY AND METHOD FOR MANUFACTURING THE SAME

(75) Inventors: Chih-Che Liu, Hsin-Chu (TW); Shih-Feng Hsu, Hsin-Chu (TW)

(73) Assignee: Au Optronics Corporation, Hsin-Chu (TW)

( * ) Notice: Subject to any disclaimer, the term of this patent is extended or adjusted under 35 U.S.C. 154(b) by 0 days.

(21) Appl. No.: 12/879,111

(22) Filed: Sep. 10, 2010

(65) Prior Publication Data
US 2011/0260607 A1  Oct. 27, 2011

(30) Foreign Application Priority Data

Apr. 27, 2010  (TW) .............................. 99113336 A

(51) Int. Cl.
*H01L 51/50* (2006.01)
*H01L 51/52* (2006.01)
(52) U.S. Cl. ........................ 313/512; 313/504
(58) Field of Classification Search .......... 313/500–512, 313/495–497, 582–587; 445/25
See application file for complete search history.

(56) References Cited

U.S. PATENT DOCUMENTS

| | | | |
|---|---|---|---|
| 6,952,078 B1 | 10/2005 | Guenther | |
| 7,125,306 B2 * | 10/2006 | Sasaki et al. | 445/24 |
| 7,317,281 B2 * | 1/2008 | Hayashi et al. | 313/512 |
| 7,608,995 B2 * | 10/2009 | Lee et al. | 313/505 |
| 7,944,144 B2 * | 5/2011 | Gomi | 313/512 |
| 2003/0073372 A1 * | 4/2003 | Nakatake et al. | 445/25 |
| 2007/0170861 A1 | 7/2007 | Lee et al. | |
| 2008/0106194 A1 * | 5/2008 | Logunov et al. | 313/512 |
| 2009/0064717 A1 | 3/2009 | Son et al. | |
| 2010/0045181 A1 * | 2/2010 | Oh et al. | 313/512 |
| 2011/0163662 A1 * | 7/2011 | Lim et al. | 313/504 |

FOREIGN PATENT DOCUMENTS

| | | |
|---|---|---|
| CN | 1406345 A | 3/2003 |
| JP | 02073229 A * | 3/1990 |
| TW | 271574 | 1/2007 |

OTHER PUBLICATIONS

English language translation of abstract of TW 271574 (published Jan. 21, 2007).
English translation of abstract and pertinent parts of CN 1406345 A.(Published Mar. 26, 2003).

* cited by examiner

*Primary Examiner* — Mariceli Santiago
(74) *Attorney, Agent, or Firm* — Thomas, Kayden, Horstemeyer & Risley, LLP

(57) ABSTRACT

Disclosed herein is an electroluminescent display that includes a first substrate, a second substrate, a light-emitting element array, a sealing member, and a supporting structure. The first substrate and the second substrate are opposite to each other, and the light-emitting element array is disposed between the first substrate and the second substrate. The sealing member is disposed between the first substrate and the second substrate such that an enclosed space is defined by the first substrate, the second substrate and the sealing member. The light-emitting element array is disposed within the enclosed space. The supporting structure is disposed between and interconnects the first substrate and the second substrate while does not form an enclosed space therewith. The sealing member and the supporting structure are both formed of a same glass frit.

12 Claims, 8 Drawing Sheets

ELECTROLUMINESCENT DISPLAY AND METHOD FOR MANUFACTURING THE SAME

RELATED APPLICATIONS

This application claims priority to Taiwan Application No. 99113336, filed Apr. 27, 2010, the entirety of which is incorporated herein by reference.

BACKGROUND

1. Field of Invention

The present invention relates to an electroluminescent display. More particularly, the present invention relates to a method for manufacturing an electroluminescent display.

2. Description of Related Art

The development and application of electroluminescent displays, especially organic electroluminescent display, come to attract increasing attention. In comparison with conventional liquid crystal displays, organic electroluminescent displays are advantageous in greater viewing angles, higher contrast, shorter response time and wider operational temperature range.

During the manufacturing process of the electroluminescent display, the device packaging is an important issue. In particular, the organic light-emitting material and/or the electrode material of the organic electroluminescent display are susceptible to degradation and/or oxidation due to moisture and oxygen, and hence, the hermeticity requirement of the packaging of the organic electroluminescent display is more stringent than other electroluminescent displays.

Conventionally, resins, such as UV-curable resins, are used to form the sealing structure of the organic electroluminescent. However, the resins are insufficient to prevent the oxygen and water vapor from permeating into the packaged device under prolonged operation.

The glass frit is a conventional alternative to the resin. However, the adhesion strength of the glass frit is inferior to that of the resin. Therefore, the devices packaged with the glass frit are more likely to fail the reliability test (such as the dropping test).

Accordingly, there exists an urgent need in the related art to provide a packaging method that can effectively protect the electroluminescent display.

SUMMARY

The following presents a simplified summary of the disclosure in order to provide a basic understanding to the reader. This summary is not an extensive overview of the disclosure and it does not identify key/critical elements of the present invention or delineate the scope of the present invention. Its sole purpose is to present some concepts disclosed herein in a simplified form as a prelude to the more detailed description that is presented later.

In one aspect, the present invention is directed to an electroluminescent display having adequate oxygen/water vapor resistance and adhesion strength.

According to one embodiment of the present invention, the electroluminescent display comprises a first substrate, a second substrate, a light-emitting element array, a sealing member and a supporting structure. The second substrate is opposite to the first substrate, whereas the light-emitting element array is disposed between the first substrate and the second substrate. The sealing member is also disposed between the first substrate and second substrate, and the first substrate, the second substrate and the sealing member together define an enclosed space for accommodating the light-emitting element array therein. The supporting structure is also disposed between the first substrate and the second substrate in such a way that the supporting structure attaches to the first substrate and the second substrate but does not form an enclosed space therewith. The sealing member and the supporting structure are made of a same glass frit.

In another aspect, the present invention is directed to a method for manufacturing an electroluminescent display. Comparing with the conventional methods, the method provided herein is less complicated, and the electroluminescent display manufactured thereby exhibits adequate oxygen/water vapor resistance and adhesion strength.

According to one embodiment of the present invention, the method comprises the steps as follows. A glass frit is coated over a surface of a first substrate, and thereby forms a sealing member pattern and a supporting structure pattern thereon, wherein the sealing member pattern formed an enclosed space, whereas the supporting structure pattern does not form another enclosed space. The surface of the first substrate is arranged to face a second substrate so that a light-emitting element array is located between the first substrate and the second substrate and within the enclosed space. The sealing member pattern and the supporting structure pattern are irradiated by a beam to at least partially melt the glass frit and thereby the first substrate and second substrate are attached via the glass frit.

Many of the attendant features will be more readily appreciated as the same becomes better understood by reference to the following detailed description considered in connection with the accompanying drawings.

BRIEF DESCRIPTION OF THE DRAWINGS

The present description will be better understood from the following detailed description read in light of the accompanying drawings, wherein.

Like reference numerals are used to designate like parts in the accompanying drawings.

DETAILED DESCRIPTION

Figure 1A:
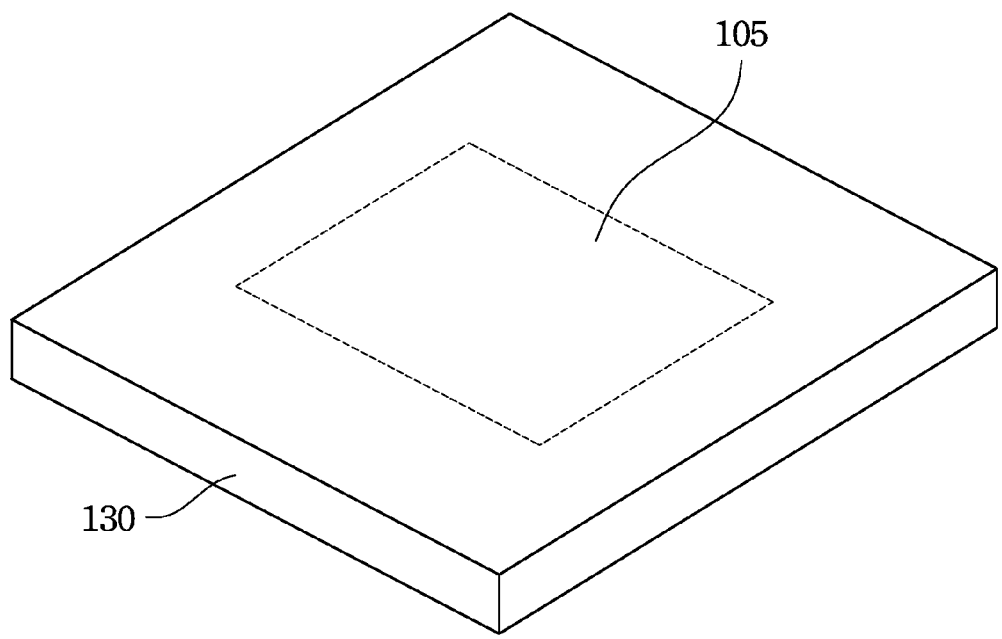
FIG. 1A to FIG. 1D are schematic diagrams illustrating the process steps for manufacturing an electroluminescent display according to one embodiment of the present invention.

The detailed description provided below in connection with the appended drawings is intended as a description of the present examples and is not intended to represent the only forms in which the present example may be constructed or utilized. The description sets forth the functions of the example and the sequence of steps for constructing and operating the example. However, the same or equivalent functions and sequences may be accomplished by different examples.

Generally, an electroluminescent display includes a light-emitting element array consisting of a plurality of light-emitting elements. Based on the arrangement of the elements and the driving principle of the devices, electroluminescent displays can be categorized into active matrix displays and passive matrix displays.

Active matrix displays and passive matrix displays share some common structural features. Regarding organic electroluminescent displays, both the active matrix organic light-emitting display (AMOLED) and the passive matrix organic light-emitting display (PMOLED) have the following structures: a lower substrate (or an array substrate), a light-emitting element array disposed on the lower substrate, and an upper substrate (or a sealing substrate).

The array of the light-emitting elements may define the active display area of the display. Each light-emitting element comprises an anode, a cathode and a light-emitting layer sandwiched therebetween. The light-emitting layer may be a single layer or consists of multiple layers, and comprises a light-emitting material. In addition to the light-emitting layer, other material layer(s), such as hole transport layer, hole injection layer, electron transport layer and/or electron injection layer, can be disposed between the anode and cathode.

A sealing structure is formed around the peripheral of the active display area. The sealing structure defines an enclosed space together with the upper and lower substrates, and thereby provides adequate protection to the light-emitting element array disposed therein. If a device life time of 10,000 hours is desired, the sealing structure of the organic electroluminescent display should have a water vapor transmission rate (WVTR) preferably lower than $10^{-6}$ g/m$^2$, and an oxygen transmission rate (OTR) preferably lower than $10^{-3}$ cc/m$^2$.

Newton ring is an optical phenomenon frequently occurs in electroluminescent displays using glass frit as the sealing structure. Newton ring is a circular interference pattern appears on the light-emitting surface of a display. In regard to a display having an upper substrate that is made of glass, if the strength of the supporting material is insufficient to support the upper substrate, the stress across the whole surface of the glass substrate would be uneven, thereby causing the upper substrate to slightly recess. As such, Newton ring would be generated when the light irradiated by the light-emitting device passes through such upper substrate.

In view of the foregoing, a method for preparing an electroluminescent display is provided herein.

According to the principles and spirits of the present invention, in addition to the sealing structure, at least one supporting structure is formed between the array substrate and the sealing substrate. Accordingly, the unevenness of the stress across the surface of the sealing substrate may be reduced, and thereby prevents the occurrence of Newton ring.

Moreover, both the sealing structure and the supporting structure are made of glass frit; as such, the adhesion strength of the display may be improved in addition to the oxygen/water vapor resistance. Furthermore, the sealing structure and the supporting structure are made of a single glass frit, and hence, the method is less complicated than conventional ones. Accordingly, the manufacturing cost and time may be reduced.

Reference is now made to the schematic diagrams of FIGS. 1A-1D, which illustrate the process steps for manufacturing an electroluminescent display according to one embodiment of the present invention.

Figure 1B:
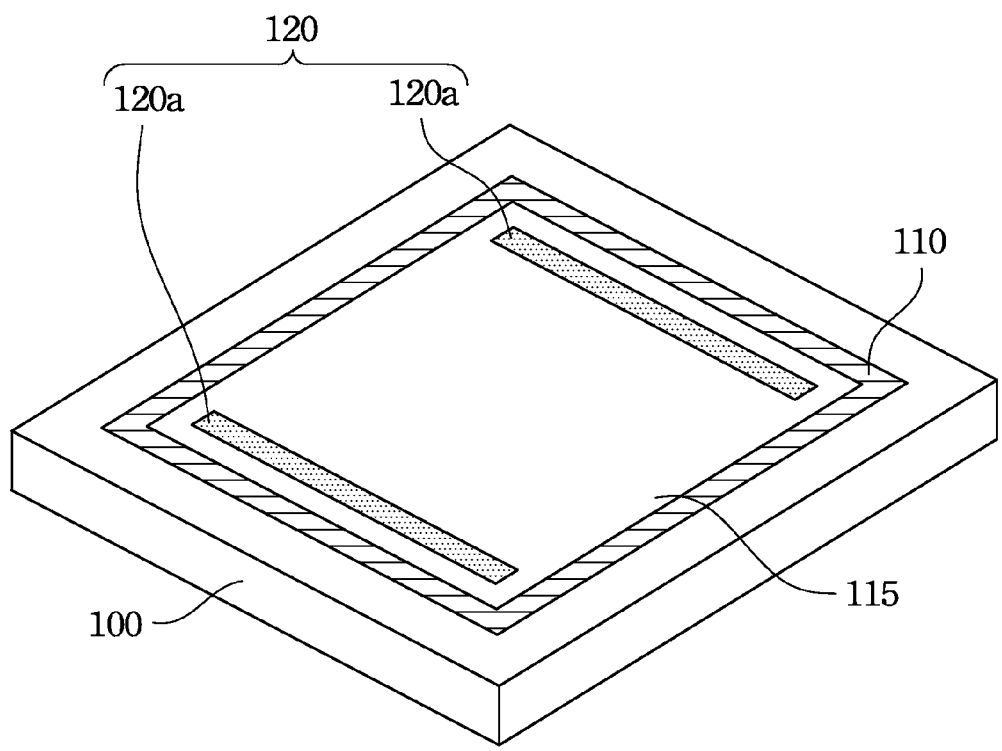

First, an array substrate 130 and a sealing substrate 100 are provided, as depicted in FIG. 1A and FIG. 1B, respectively. A light-emitting element array (not shown in FIG. 1A) is formed on a surface of the array substrate 130, and the light-emitting element array defines an active display area 105, as shown in FIG. 1A.

The array substrate 130 may be any suitable substrate, such as a flexible substrate or a rigid substrate; a transparent substrate or an opaque substrate, etc. For example, examples of the material of the array substrate 130 may include, but are not limited to: thermoplastic material, thermosetting material, glass, and/or metal foil.

Moreover, the light-emitting element array described herein may be an active matrix array or a passive matrix array. The light-emitting elements of the array may be any suitable light-emitting elements, including but are not limited to, organic light-emitting devices.

The material suitable for use as the array substrate 130 may also be used as the material of the sealing substrate 100, and the material of the array substrate 130 and the material of the sealing substrate 100 may be the same or different.

Next, a glass frit is coated over the upper surface of the sealing substrate 100, and thereby forms a sealing member pattern 110 and a supporting structure pattern 120 thereon, as depicted in FIG. 1B. The sealing member pattern 110 forms an enclosed space 115, which corresponds to and surrounds the active display area 105 illustrated in FIG. 1A; whereas the supporting structure pattern 120 does not form another enclosed space that surrounds the active display area 105.

In one optional embodiment, it is preferred that the sealing member pattern 110 and the supporting structure pattern 120 are simultaneously formed on the upper surface of the sealing substrate 100.

According to the principles and spirits of the present invention, the glass frit may be coated onto the upper surface of the sealing substrate 100 by any suitable techniques and/or apparatus. An illustrative example for performing the coating step is the screen printing process.

Specifically, a mask having a specific pattern that corresponds to the sealing member pattern 110 and the supporting structure pattern 120 may be provided first. Thereafter, a screen printing process is carried out using the mask to form the sealing member pattern 110 and the supporting structure pattern 120 on the upper surface of the sealing substrate 100. The mask for screen printing may be made of a single layer or multiple layers.

The composition of the glass frit according to the present invention is not subject to any limitation, as long as it is capable of solidify after being melted, and the resultant solid may provide the required adhesion strength and oxygen/water vapor transmission rates. However, it should be noted that according to the principles and spirits of the present invention, the sealing member pattern 110 and the supporting structure pattern 120 are made of the same glass frit. As such, the complexity of the manufacturing process may be substantially reduced.

As can be seen in FIG. 1B, the supporting structure pattern 120 comprises two supporting member patterns 120a that are disposed inside the enclosed space 115 and between the sealing member pattern 110 and the corresponding active display area 105. However, it should be appreciated that the present invention is not limited to this particular arrangement.

For example, the supporting structure pattern may be disposed outside enclosed space 115; alternatively, the supporting structure pattern may comprise a single supporting member pattern or no less than three supporting member patterns. Other illustrative examples regarding the arrangement of the supporting structure pattern are described hereinafter in connection with FIG. 2A to FIG. 2H. Moreover, the shape of the supporting member pattern is not limited to the bar-shape and may include any other suitable shapes.

Figure 1C:
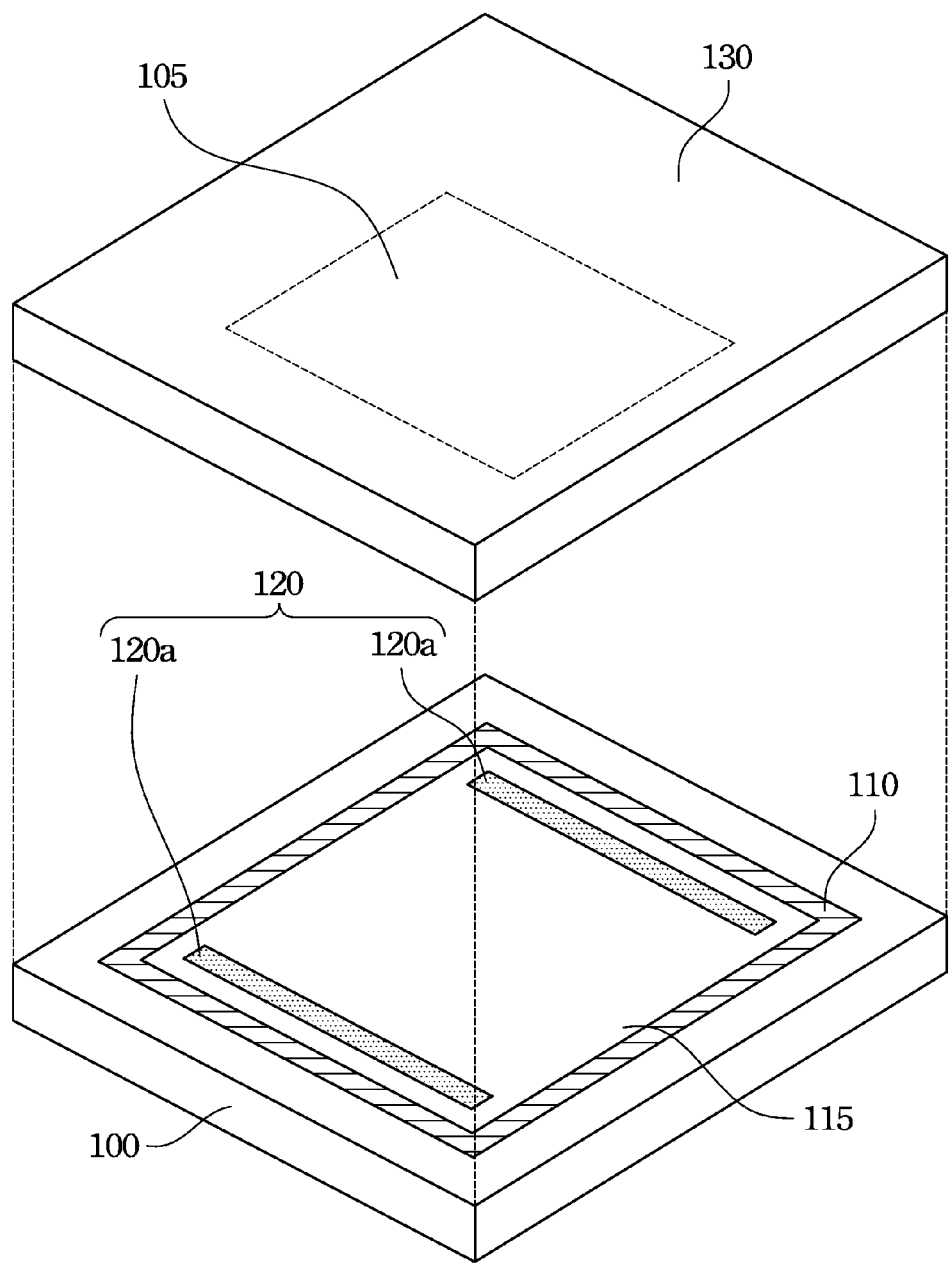

After the coating step, the array substrate 130 and the upper surface of the sealing substrate 100 are arranged so that the light-emitting element array (not shown) is disposed between the array substrate 130 and the sealing substrate 100, as depicted in FIG. 1C.

Figure 1D:
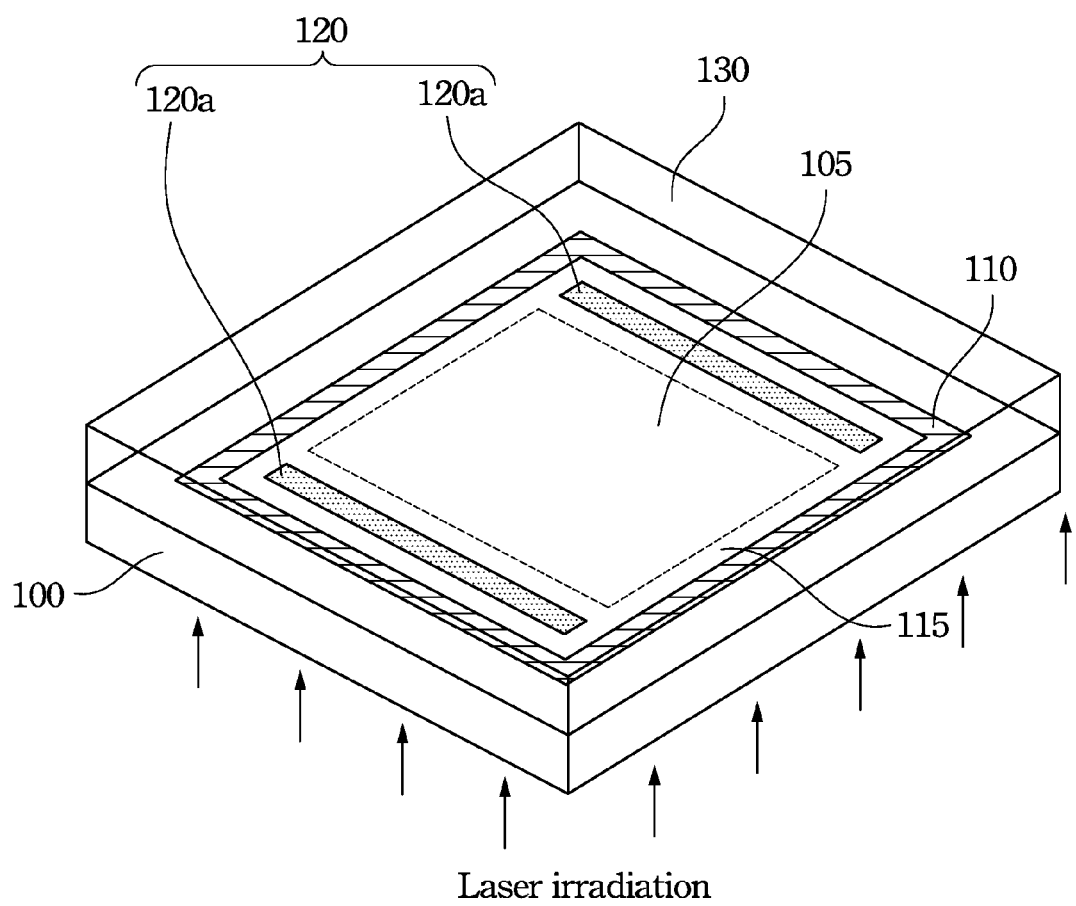

Thereafter, as shown in FIG. 1D, the sealing member pattern 110 and the supporting structure pattern 120 are irradiated with a beam so as to at least partially melt the glass frit of the sealing member pattern 110 and the supporting structure pattern 120 and thereby attaching the sealing substrate 100 and the array substrate 130 via the glass frit.

Although a laser beam, such as infrared laser, is depicted in FIG. 1D, the method of the present invention is not limited thereto. Rather, other beam (infrared, for example) may be used to implement the method.

Moreover, the beam for irradiating the sealing member pattern 110 and the supporting structure pattern 120 may be incident from the side of the sealing substrate 100 or the array substrate 130, or even from both sides of the sealing substrate 100 and the array substrate 130. In operation, the wavelength, diameter and/or power of the beam may be adjusted depending on the manufacturing need.

Figure 1E:
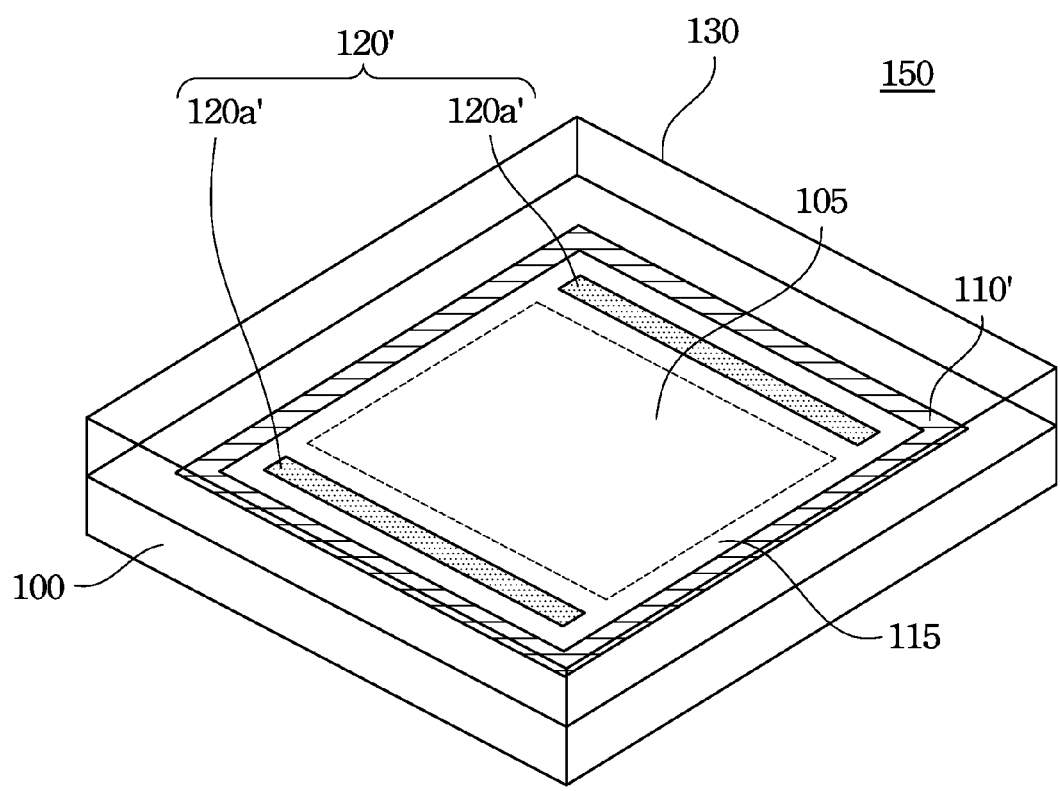
FIG. 1E is a schematic diagram of an electroluminescent display according to one embodiment of the present invention.

The energy of the beam may cause the glass frit to melt. Upon the end of the irradiation, the melted glass frit would gradually solidify, and thereby forms the sealing member 110' and the supporting structure 120', as depicted in FIG. 1E. As such, the electroluminescent display 150 of FIG. 1E can be formed, wherein the sealing member 110' may provide the desired hermeticity property and exhibit required oxygen/water vapor transmission rates; whereas the two supporting member 120a' constitute the supporting structure 120' may provide additional supporting strength, and thereby reduce the possibility of the occurrence of Newton ring. Moreover, the supporting structure 120' interconnecting the sealing substrate 100 and the array substrate 130 may further improve the reliability of the electroluminescent display 150.

Although the process steps illustrated in FIG. 1A to FIG. 1E is directed to a method for manufacturing a single electroluminescent display, the method provide herein can be equally applied to the fabrication on a mass production basis.

Generally, in mass production, multiple light-emitting element arrays are formed on a substrate. In this case, the method described hereinabove may be performed to produce multiple display units, and then, the substrate having the multiple display units thereon is cut to produce multiple electroluminescent displays 150.

Furthermore, although the process described in connection with FIG. 1A to FIG. 1E is directed to coating the glass frit on the upper surface of the sealing substrate 100, the method of the present invention is not limited thereto.

In an alternative embodiment, the glass frit may be coated onto a surface of the array substrate 130 so as to form the sealing member pattern 110 and the supporting structure pattern 120 thereon.

Thereafter, said surface of the array substrate 130 is arranged to face a surface of the sealing substrate 100 so that the light-emitting element array (not shown) is disposed between the array substrate 130 and the sealing substrate 100, and the active display area 105 defined by the light-emitting element array is located within the enclosed space 115 formed by the sealing member pattern 110, the sealing substrate 100 and the array substrate 130, as depicted in FIG. 1C. Then, the irradiation step is performed so as to produce the electroluminescent display 150 shown in FIG. 1E.

According to the embodiments of the present invention, the number and the arrangement of the supporting member(s) may be adjusted depending on the manufacturing need to provide the required support and adhesion. For example, the pattern of the mask for screen printing the glass frit may be altered to form various supporting structure pattern.

Reference is now made to the schematic diagrams of FIG. 2A to FIG. 2H, which depict electroluminescent displays according to various embodiments of the present invention for the purpose of illustration only.

Figure 2A:
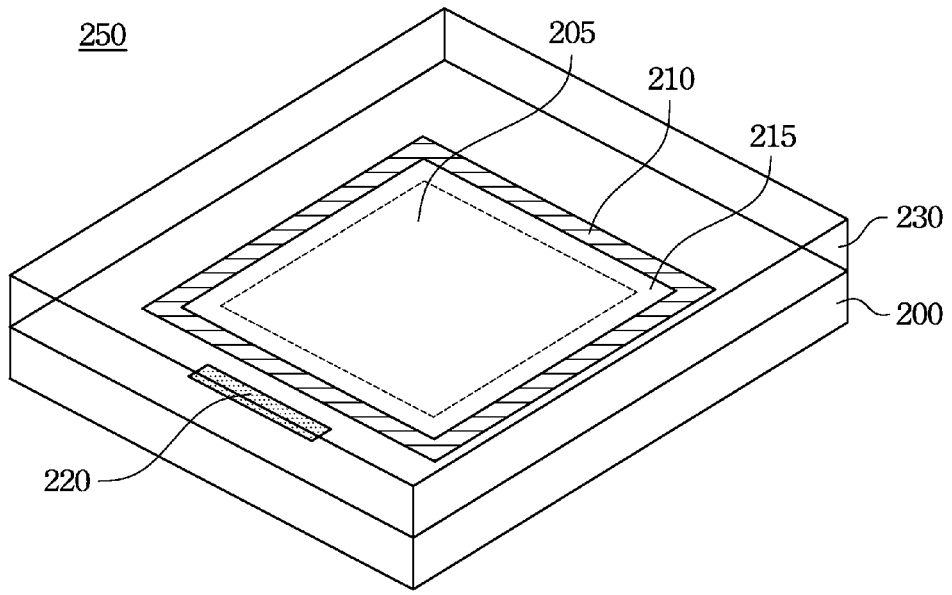
FIG. 2A to FIG. 2H are schematic diagrams of electroluminescent displays according to various embodiments of the present invention.

In FIG. 2A to FIG. 2H, each electroluminescent display 250 comprises a first substrate (such as a sealing substrate) 200, a second substrate (such as the array substrate 230), a light-emitting element array (not shown), a sealing member 210 and a supporting structure 220. The light-emitting element array defines an active display area 205 of the display. The sealing member 210, the first substrate 200 and the second substrate 230 together define an enclosed space 215 for sealing the light-emitting element array therein, as depicted in FIG. 2A where the sealing member 210 surrounds the peripheral of the active display area 205.

Each of the electroluminescent display 250 shown in FIG. 2A to FIG. 2H is similar to electroluminescent display 150 of FIG. 1E in structure, except for the arrangement of the supporting structure 220 therein. The method and materials for manufacturing the electroluminescent display 250 are substantially the same with that of the electroluminescent display 150. Accordingly the detailed description is omitted for the sake of brevity, and only the difference relating to the arrangement of the supporting structures is provided hereinafter. It should be noted that, in the context of the following embodiments, the side where the sealing member 210 contacts the enclosed space 215 is referred to as the inner side of the sealing member 210, whereas the other side is the outer side of the sealing member 210.

In FIG. 2A, the electroluminescent display 250 has a supporting structure 220 comprises a single supporting member. Said supporting structure 220 is disposed at a lateral side of the sealing member 210 and outside the enclosed space 215 (that is, at the outer side of the sealing member 210).

Figure 2B:
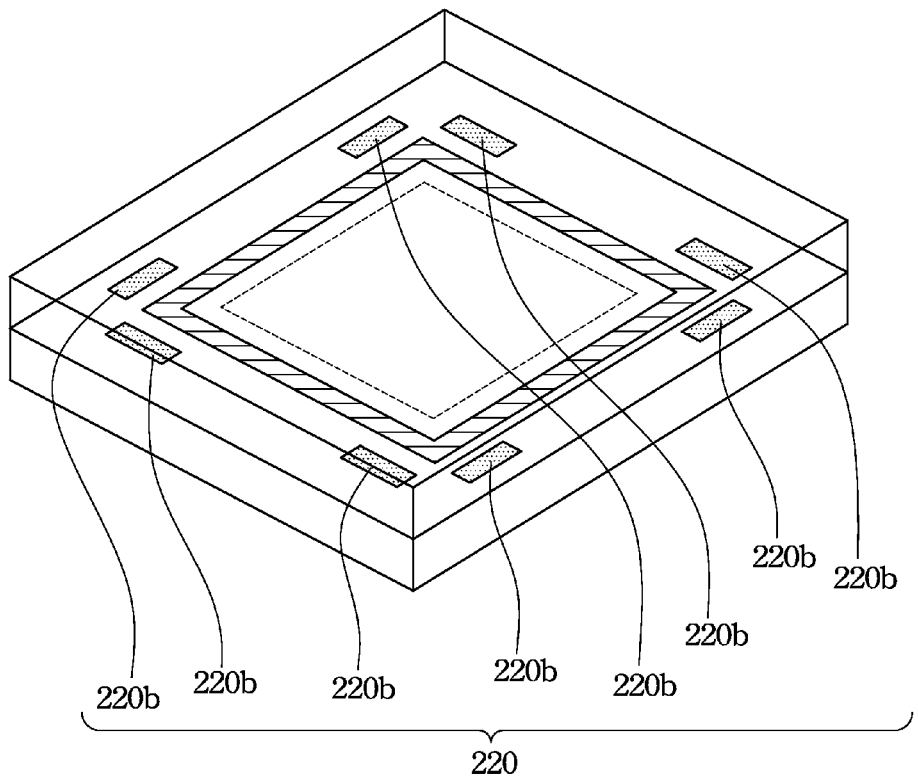

The supporting structure 220 of the electroluminescent display 250 depicted in FIG. 2B comprises eight supporting members 220b. All of the supporting members 220b are disposed at the outer side of the sealing member 210, and are adjacent to the corner of the sealing member 210, respectively.

Figure 2C:
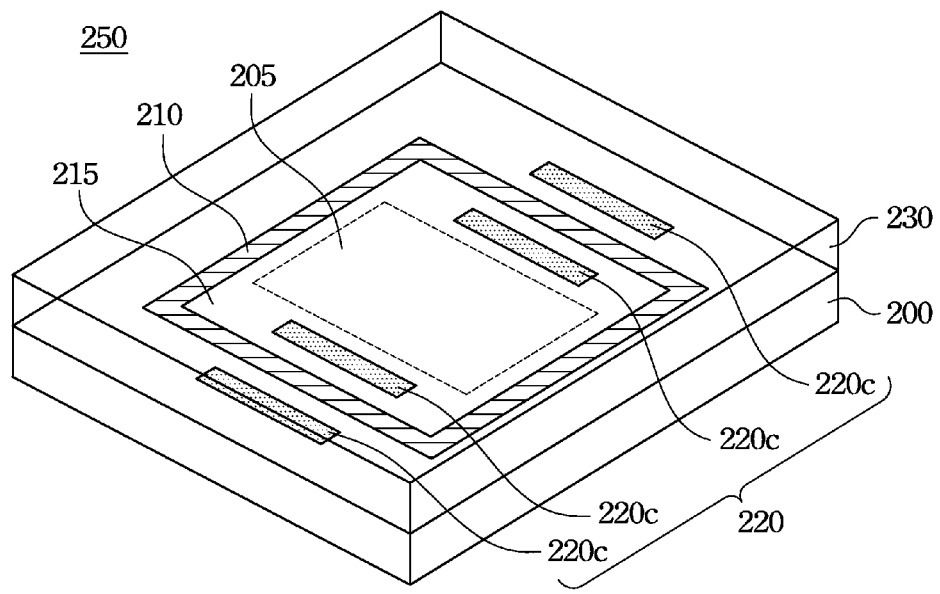

The electroluminescent display 250 of FIG. 2C has a supporting structure 220 comprising four supporting members 220c. The supporting members 220c are respectively disposed at the inner side and the outer side of two lateral sides of the sealing member 210. More specifically, two of the supporting members 220c are disposed inside the enclosed space 215 whereas the other two of the supporting members 220c are disposed outside the enclosed space 215.

Figure 2D:
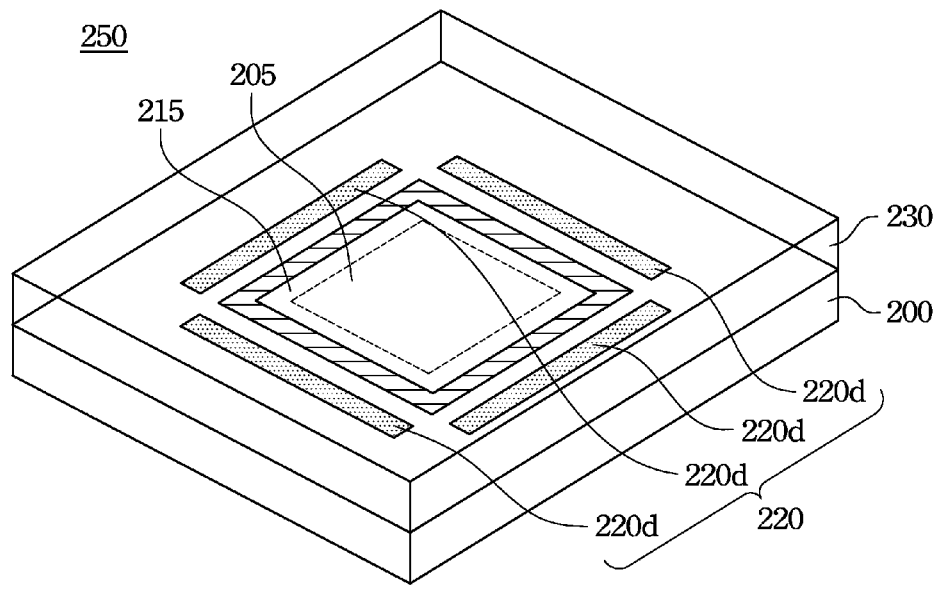
Figure 2E:
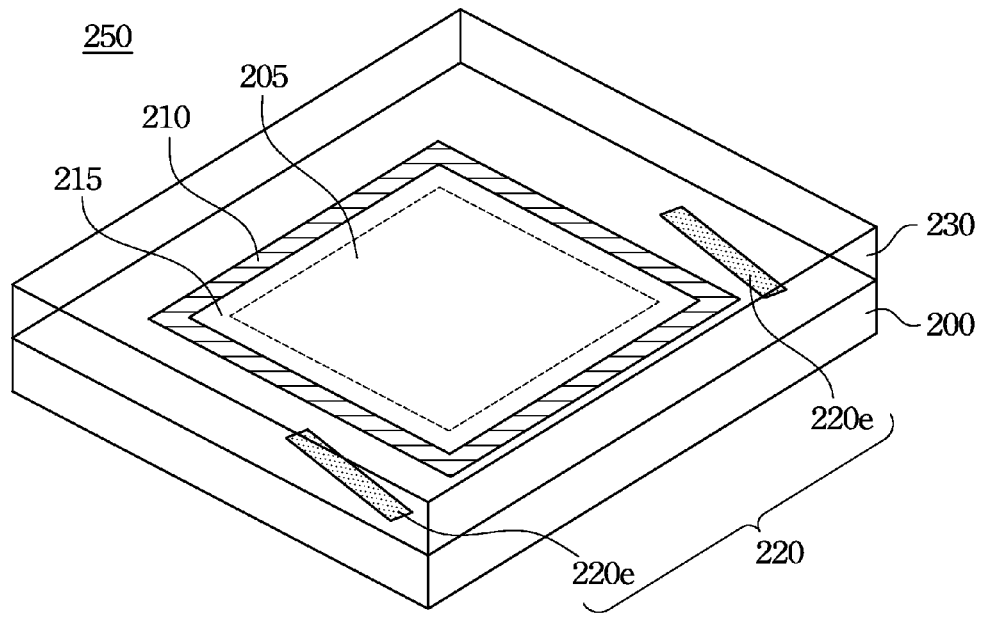

In FIG. 2D, the supporting structure 220 of the electroluminescent display 250 also comprises four supporting members 220d. All of the four supporting members 220d are respectively disposed at the outer side of the four lateral sides of the sealing member 210. That is, the four supporting members 220d are disposed outside the enclosed space 215.

The electroluminescent display 250 has a supporting structure 220 comprising two supporting members 220e. The two supporting member 220e are respectively disposed at the outer side of the two lateral sides of the sealing member 210, and an included angle is formed between the extension direction of the respective supporting member 220e and the adjacent lateral side of the sealing member 210. In other words, the supporting member 220e and the adjacent lateral side of the sealing member 210 are not parallel to each other.

With respect to the electroluminescent displays 250 depicted in FIG. 2A to FIG. 2E, the supporting structure 220 (or the supporting members 220b, 220c, 220d and 220e) is not connected to the sealing member 210. The embodiments according to FIG. 2F to FIG. 2H as follows illustrate the examples where the supporting structure 220 (or the supporting members 220*f*, 220*g* and 220*h*) is connected to the sealing member 210.

Figure 2F:
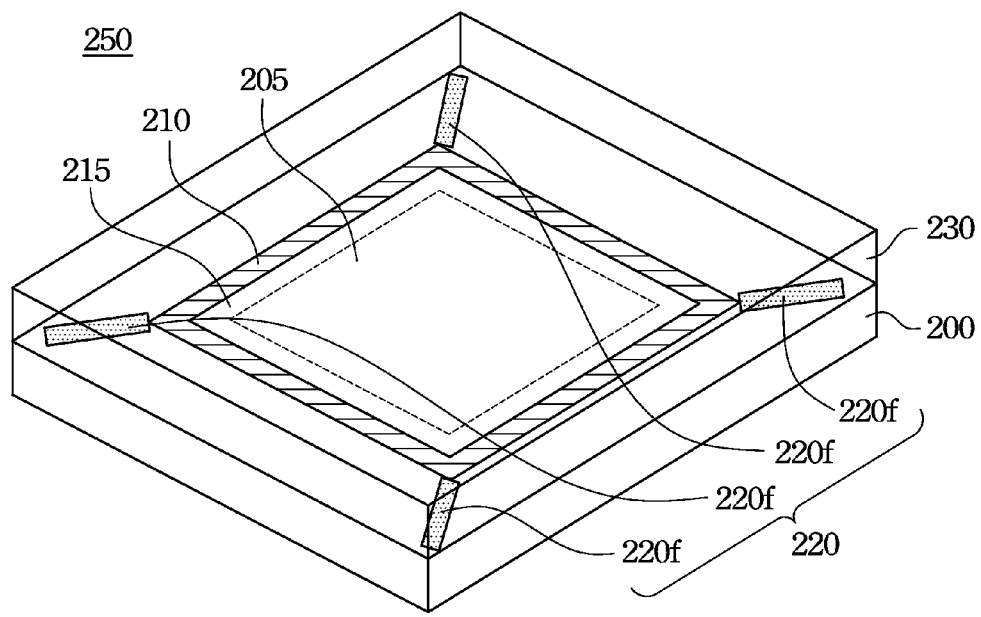

As shown in FIG. 2F, the electroluminescent display 250 has a supporting structure 220 comprising four supporting members 220*f*. The four supporting members 220*f* are respectively disposed at the four corners of the sealing member 220*f* and extend outward from the sealing member 210.

Figure 2G:
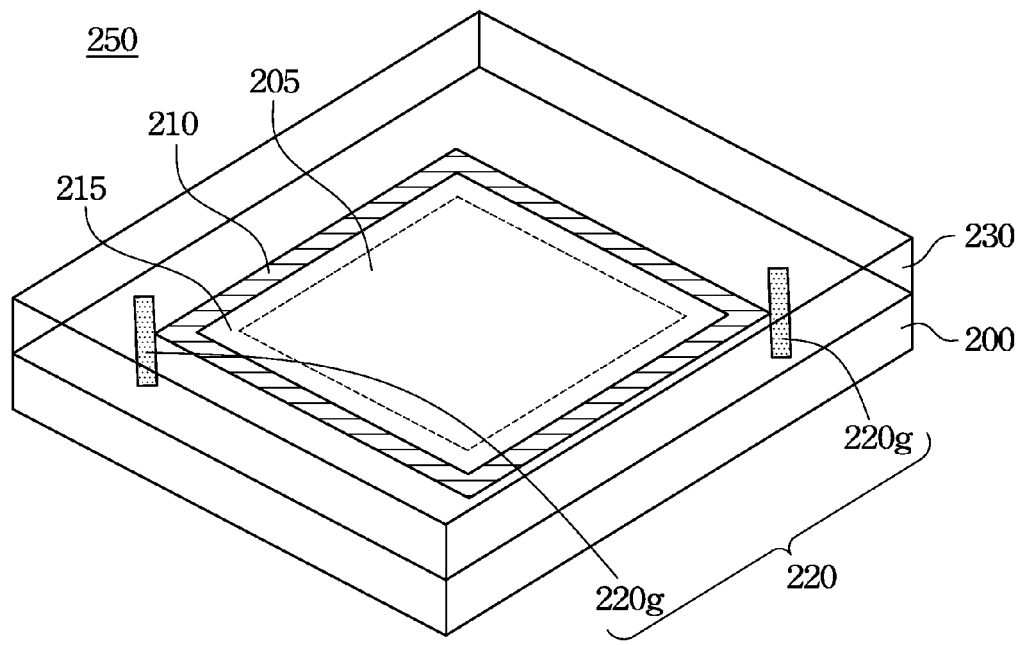

The electroluminescent display 250 depicted in FIG. 2G has a supporting structure 220 comprising two supporting members 220*g*. The two supporting member 220*g* are respectively disposed at two corners of the sealing member 210 and externally tangent to the outer side of the sealing member 210.

Figure 2H:
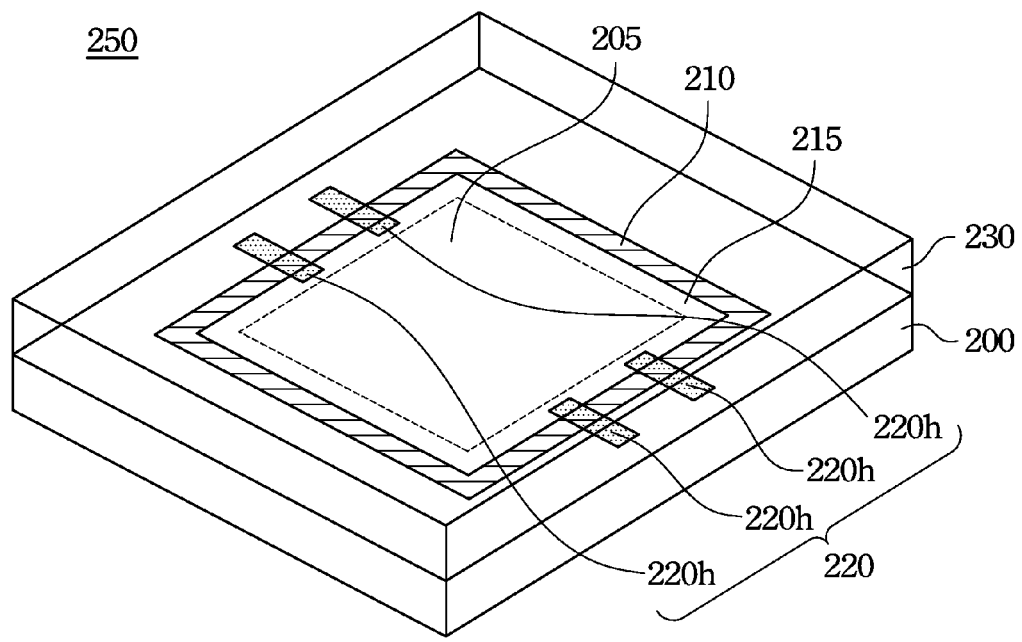

The supporting structure 220 of the electroluminescent display 250 in FIG. 2H comprises six supporting members 220*h*. The six supporting members 220*h* are respectively disposed at the lateral sides of the sealing member 210, wherein at least a portion of each supporting member 220*h* is disposed inside the enclosed space 215 whereas another portion of the supporting member 220*h* is disposed outside the enclosed space 215.

In the case where the supporting structure (or the supporting member) does not connect to the sealing member, there is a gap between the supporting structure and the sealing member. Generally, the width of the gap is at most about 500 μm.

The various arrangements of the support member depicted in FIG. 1E and FIG. 2A to FIG. 2H may be combined with or replaced by one another. For example, the number and/or position of the supporting member(s) may be altered, and all of such modifications and variations fall within the scope of the present invention.

It will be understood that the above description of embodiments is given by way of example only and that various modifications may be made by those with ordinary skill in the art. The above specification, examples and data provide a complete description of the structure and use of exemplary embodiments of the invention. Although various embodiments of the invention have been described above with a certain degree of particularity, or with reference to one or more individual embodiments, those with ordinary skill in the art could make numerous alterations to the disclosed embodiments without departing from the spirit or scope of this invention.

What is claimed is:

1. An electroluminescent display, comprising:
   a first substrate;
   a second substrate opposite to the first substrate;
   a light-emitting element array disposed between the first substrate and the second substrate;
   a sealing member disposed between the first substrate and the second substrate, wherein the first substrate, the second substrate and the sealing member together define an enclosed space for accommodating the light-emitting element array therein; and
   a supporting structure disposed between and interconnecting the first substrate and the second substrate, wherein the supporting structure does not form another enclosed space, the sealing member and the supporting structure are made of a same glass frit, the supporting structure connects to the sealing member, and a portion of the supporting structure is disposed inside the enclosed space, whereas the other portion of the supporting structure is disposed outside the enclosed space.

2. The electroluminescent display of claim 1, wherein the supporting structure and the sealing member have a gap therebetween.

3. The electroluminescent display of claim 1, wherein the supporting structure is disposed at least one corner of the sealing member.

4. The electroluminescent display of claim 1, wherein the supporting structure is disposed at least one lateral side of the sealing member.

5. An electroluminescent display, comprising:
   a first substrate;
   a second substrate opposite to the first substrate;
   a light-emitting element array disposed between the first substrate and the second substrate;
   a sealing member disposed between the first substrate and the second substrate, wherein the first substrate, the second substrate and the sealing member together define an enclosed space for accommodating the light-emitting element array therein; and
   a supporting structure disposed between and interconnecting the first substrate and the second substrate, wherein the supporting structure does not form another enclosed space, the sealing member and the supporting structure are made of a same glass frit, the supporting structure comprises a plurality of supporting members, and one of the supporting members is disposed inside the enclosed space, whereas another one of the supporting members is disposed outside the enclosed space.

6. The electroluminescent display of claim 5, wherein the supporting structure and the sealing member have a gap therebetween.

7. The electroluminescent display of claim 5, wherein the supporting structure is disposed at least one corner of the sealing member.

8. The electroluminescent display of claim 5, wherein the supporting structure is disposed at least one lateral side of the sealing member.

9. An electroluminescent display, comprising:
   a first substrate;
   a second substrate opposite to the first substrate;
   a light-emitting element array disposed between the first substrate and the second substrate;
   a sealing member disposed between the first substrate and the second substrate, wherein the first substrate, the second substrate and the sealing member together define an enclosed space for accommodating the light-emitting element array therein; and
   a supporting structure disposed between and interconnecting the first substrate and the second substrate, wherein the supporting structure does not form another enclosed space, the sealing member and the supporting structure are made of a same glass frit, the supporting structure has an extension direction, and an included angle is formed between the extension direction and an adjacent lateral side of the sealing member.

10. The electroluminescent display of claim 9, wherein the supporting structure and the sealing member have a gap therebetween.

11. The electroluminescent display of claim 9, wherein the supporting structure is disposed at least one corner of the sealing member.

12. The electroluminescent display of claim 9, wherein the supporting structure is disposed at least one lateral side of the sealing member.

* * * * *